United States Patent
Yiu et al.

(10) Patent No.: US 7,323,784 B2
(45) Date of Patent: Jan. 29, 2008

(54) TOP VIA PATTERN FOR BOND PAD STRUCTURE

(75) Inventors: Ho-Yin Yiu, Hsinchu (TW); Fu-Jier Fan, Hsinchu Hsien (TW); Yu-Jui Wu, Su-ao Township (TW); Aaron Wang, Hsin Chu (TW); Hsiang-Wei Wang, Hsin-Chu (TW); Huang-Sheng Lin, Hsin Chu (TW); Ming-Hsien Chen, Hsin Chu (TW); Ruey-Yun Shiue, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 11/081,704

(22) Filed: Mar. 17, 2005

(65) Prior Publication Data

US 2006/0208360 A1    Sep. 21, 2006

(51) Int. Cl.
*H01L 29/40* (2006.01)
(52) U.S. Cl. .............................. 257/774; 257/E29.119; 257/E23.011; 257/E21.577; 257/E23.145; 438/637; 438/672
(58) Field of Classification Search ................ 257/782, 257/774, 786, E29.119, E23.011, E23.067, 257/E23.145, E23.174, E21.577, E21.586; 438/637, 672
See application file for complete search history.

(56) References Cited

U.S. PATENT DOCUMENTS

| | | | |
|---|---|---|---|
| 6,163,074 A * | 12/2000 | Lee et al. | 257/734 |
| 6,306,750 B1 | 10/2001 | Huang et al. | |
| 6,552,435 B2 | 4/2003 | Noble | |
| 6,822,329 B2 * | 11/2004 | Varrot et al. | 257/758 |
| 2001/0009802 A1 * | 7/2001 | Lee | 438/612 |
| 2004/0021227 A1 * | 2/2004 | Watanabe | 257/773 |

FOREIGN PATENT DOCUMENTS

| JP | 2001-261199 A | 9/2001 |
|---|---|---|
| JP | 2002-134509 A | 5/2002 |

\* cited by examiner

*Primary Examiner*—W. David Coleman
*Assistant Examiner*—Su C. Kim
(74) *Attorney, Agent, or Firm*—Birch, Stewart, Kolasch & Birch, LLP

(57) ABSTRACT

Top via pattern for a bond pad structure has at least one first via group and at least one second via group adjacent to each other. The first via group has at least two line vias extending in a first direction. The second via group has at least two line vias extending in a second direction different from said first direction. The line via of the first via group does not cross the line via of the second via group.

12 Claims, 2 Drawing Sheets

TOP VIA PATTERN FOR BOND PAD STRUCTURE

TECHNICAL FIELD

The present invention relates to bond pad structures for integrated circuits, and particularly to top via patterns for bond pad structures and method of forming the same.

BACKGROUND

Wire bonds, physically, as well as electrically, connected to underlying circuitry, of semiconductor chips, are used to connect the specific semiconductor chip to packaging elements, such as printed circuit board, or ceramic modules. Bond pads are the interfaces between the integrated circuits contained in semiconductor chips and the chip package. A large number of bond pads are required to transmit power/ground and input/output signals to the chip devices. It is thus important that reliability of bond pad be sufficiently high to ensure high yield. The general bond pad consists of metal layers separated by inter-metal dielectric (IMD) layers and metal vias passing the IMD layers for electrically connecting the metal layers. A passivation layer covers the surface, except over the bonding sites, to seal the chip from contaminants and for scratch protection. Wires are bonded to the bond pad and to the chip package forming electrical connections between the chip and the package.

In most cases metal vias are patterned as an array of grids in the IMD layer underlying an uppermost metal layer. The large, exposed, surface area of IMD layer, however, located surrounding the smaller regions of metal vias, can result in defect formation, or cracking of the IMD layer, as a result of the large bonding force, experienced during the wire bondingtests, where the large bonding force is distributed throughout the overlying bond pad. A significant failure mode involves cracking of the IMD layer. Once a small crack is initiated to propagate along the IMD layer, under stresses it will grow extensively during subsequent processes. One approach for eliminating the cracks, the top metal via is designed as a mesh pattern. Such a mesh via pattern is often formed or deposited in a manner that can't fully fill holes to provide poor coverage on intersection areas where line vias cross with each other, mainly because of a marginal photolithography process window induced by circuits under pad (CUP) layout. This impacts reliability, bondability and quality control (QC) results, and the yield impact may reach 10~15% depending on variations in chip size. In order to avoid problems in devices that could arise from non-fully filled metal vias, design rules do not allow integrated circuits to underlie the bond pad.

SUMMARY OF THE INVENTION

Embodiments of the present invention include top via patterns for bond pad structures to avoid poor coverage at an intersection of line vias, thus improving reliability, bondability and quality control results.

In one aspect, the present invention provides a bond pad structure has a first metal layer, a second metal layer over the first metal layer, a dielectric layer between the first metal layer and the second metal layer, and a metal via pattern located in the dielectric layer and electrically connecting the first metal layer and the second metal layer. The metal via pattern has at least one first via group and at least one second via group adjacent to each other. The first via group has at least two first line vias extending in a first direction, the second via group has at least two second line vias extending in a second direction different from the first direction, and the first line via does not cross the second line via.

In another aspect the present invention provides a metal via pattern having a plurality of first via groups and second via groups arranged in a matrix array. The first via group has at least two first line vias extending in a first direction, the second via group has at least two second line vias extending in a second direction perpendicular to the first direction. The first via group has three line vias arranged in parallel. The second via group comprises three line vias arranged in parallel. An integrated circuit is located under the bond pad structure.

DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
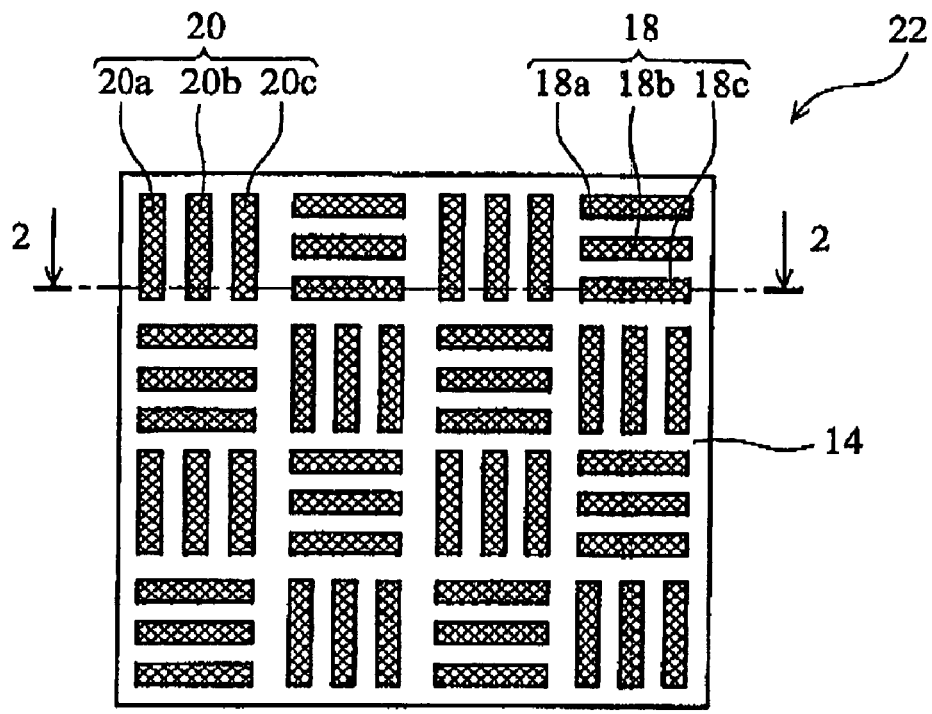
FIG. 1 is a plane view illustrating an exemplary embodiment of a top via pattern.

Embodiments of the present invention provide top via patterns for bond pad structures to overcome the aforementioned problems of the prior art arising from the poor coverage at the intersection of line vias. The top via pattern of the present invention provides at least two via groups consisting of line vias that keep adhesive results. Particularly, two adjacent via groups have line vias extending in different directions without generating an intersection area there between, which avoids poor via coverage so as to improve reliability, bondability and quality control results. Each via group may have line vias distributed isotropically and homogeneously for better ball shear performance. In addition, at least part of integrated circuits located under the bond pad structure, referred to as circuits under pad (CUP), is allowed for a more efficient use of chip area or a reduction of chip size.

As used throughout this disclosure, the term "metal via" refers to a metal-filled opening in an IMD layer, the term "top via pattern" refers to a metal via pattern in an IMD layer underlying an uppermost metal layer of a bond pad structure, and the term "line via" refers to a stripe-shaped metal via in an IMD layer. For back-end-of-line (BEOL) interconnection technologies, the term "$M_{top}$ metal layer" refers to a first-level metal layer (e.g., the uppermost metal layer) fabricated as the top interconnection level metal layer, the term "$M_{top1}$ metal layer" refers to a second-level metal layer fabricated underlying the $M_{top}$ metal layer, and the term "$M_{top-N}$ metal layer" refers to an $N_{th}$-level metal layer fabricated underlying the $M_{top-(N-1)}$ metal layer, wherein N is an integer equal to or larger than 1. Embodiments of the present invention use copper-based conductive materials for forming the $M_{top}$ metal layer and the $M_{top-N}$ metal layer. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection. Although the embodiments of the present invention illustrate copper interconnection patterns, the present invention also provides value when using metallic materials excluding copper for BEOL interconnection.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
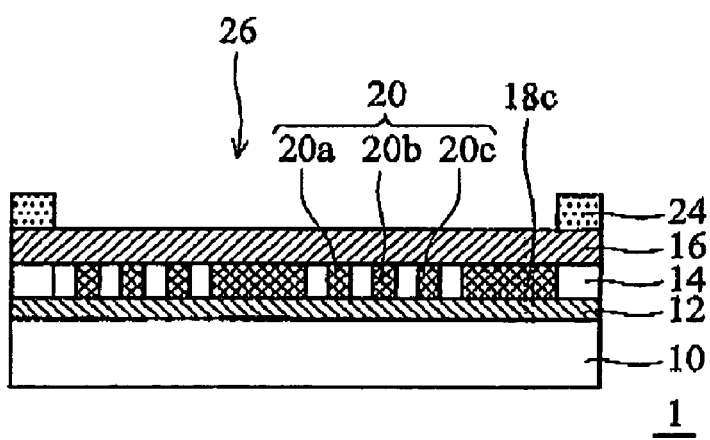
FIG. 2 is a cross-sectional view illustrating a bond pad structure having the top via pattern along line 2-2 of FIG. 1.

Herein, a plane view of FIG. 1 illustrates an exemplary embodiment of a top via pattern, and a cross sectional view of FIG. 2 illustrates a bond pad structure 1 having the top via pattern along line 2-2 of FIG. 1. An example of an integrated circuit substrate 10 used for interconnection fabrication may comprise a semconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a substrate comprising Ge, GaAs, GaP, InAs and InP. The integrated circuits as used herein refer to electronic circuits having multiple individual circuit elements, such as transistors, diodes, resistors, capacitors, inductors, and other active and passive semiconductor devices.

On the substrate 10, an inter-metal dielectric (IMD) layer 14 is fabricated as a top-level IMD layer which comprises a top via pattern 22 formed between a $M_{top-1}$ metal layer 12 and a $M_{top}$ metal layer 16. A passivation layer 24 is formed on the $M_{top}$ metal layer 16 to define a pad window 26 including a bonding area, a probing area or a combination thereof. The $M_{top}$ metal layer 16 comprises a terminal contact region, which is a portion of conductive routs and has an exposed surface (e.g., the pad window 26) in electrical communication with a metal pad and a bonding wire. For a more efficient use of chip area or a reduction of chip size, at least part of integrated circuits can be designed under a bond pad structure, resulting in a circuits under pad (CUP) region at the $M_{top}$ metal layer 14. Suitable materials for the $M_{top-1}$ metal layer 12 and the $M_{top}$ metal layer 16 may include, but are not limited to, for example copper, copper alloy, or other copper-based conductive materials. The IMD layer 14 is formed of a thickness of about 1000 angstroms to about 20000 angstroms through any of a variety of techniques including, spin coating, CVD, and future-developed deposition procedures. The IMD layer 14 may comprise $SiO_2$, $SiN_x$, SiON, PSG, BPSG, F-containing $SiO_2$, or various types of low-k films of a comparatively low dielectric constant dielectric material with a k value less than about 3.9, e.g., 3.5 or less. A wide variety of low-k materials may be employed in accordance with embodiments of the present invention, for example, spin-on inorganic dielectrics, spin-on organic dielectrics, porous dielectric materials, organic polymer, organic silica glass, fluorinated silicate glass (FSG), diamond-like carbon, HSQ (hydrogen silsesquioxane) series material, MSQ (methyl silsesquioxane) series material, or porous organic series material.

The top via pattern 22 comprises a plurality of metal-filled striped-shaped trenches, named line vias, which are substantially registered with first via groups 18 and second via groups 20 according to different extending directions of the line vias. The first via groups 18 and the second via groups 20 may be arranged in various forms chosen specifically for requirements of via density, mechanical strength and device performance. In one embodiment, each of the first via groups 18 is located adjacent to each of the second via groups 20 such as to be arranged in a matrix array. For example, along each row (or column) of the matrix array, the first via groups 18 and the second via groups 20 are arranged in respectively different sequences in mutually adjacent rows (or columns). In one embodiment, each of the via groups 18 and 20 are kept as a square profile. Alternatively, each of the via groups 18 and 20 may be kept as a rectangular shape, a quadrilateral shape or any other geometric shape. Each of the first via groups 18 comprises at least two line vias that may extend in an identical direction or in different directions. Each of the second via groups 20 comprises at least two line vias that may extend in an identical direction or in different directions. Particularly, for two adjacent via groups 18 and 20, each line via of the first via group 18 is not allowed to cross each line via of the second via group 20 so as to avoid poor coverage at an intersection of two line vias. The arrangement, number and dimension of the line vias in one via group are not limited in the present invention. For example, the line vias of one via group may be randomly distributed to keep this via group as a square profile.

In one embodiment, each of the first via groups 18 comprises at least two line vias extending in a first direction. Each of the second via groups 20 comprises at least two line vias extending in a second direction different from the first direction. For example, the first direction is substantially perpendicular to the second direction. In one embodiment, each of the first via groups 18 comprises three line vias 18a, 18b and 18c arranged in parallel, each of the second via groups 20 comprises three line vias 20a, 20b and 20c arranged in parallel, and the line vias 18a, 18b and 18c are substantially perpendicular to the line vias 20a, 20b and 20c. Particularly, for two adjacent via groups 18 and 20, each line via (18a, 18b or 18c) of the first via group 18 is not allowed to cross each line via (20a, 20b or 20c) of the second via group 20 so as to avoid poor coverage at an intersection of two line vias.

Figure 3:
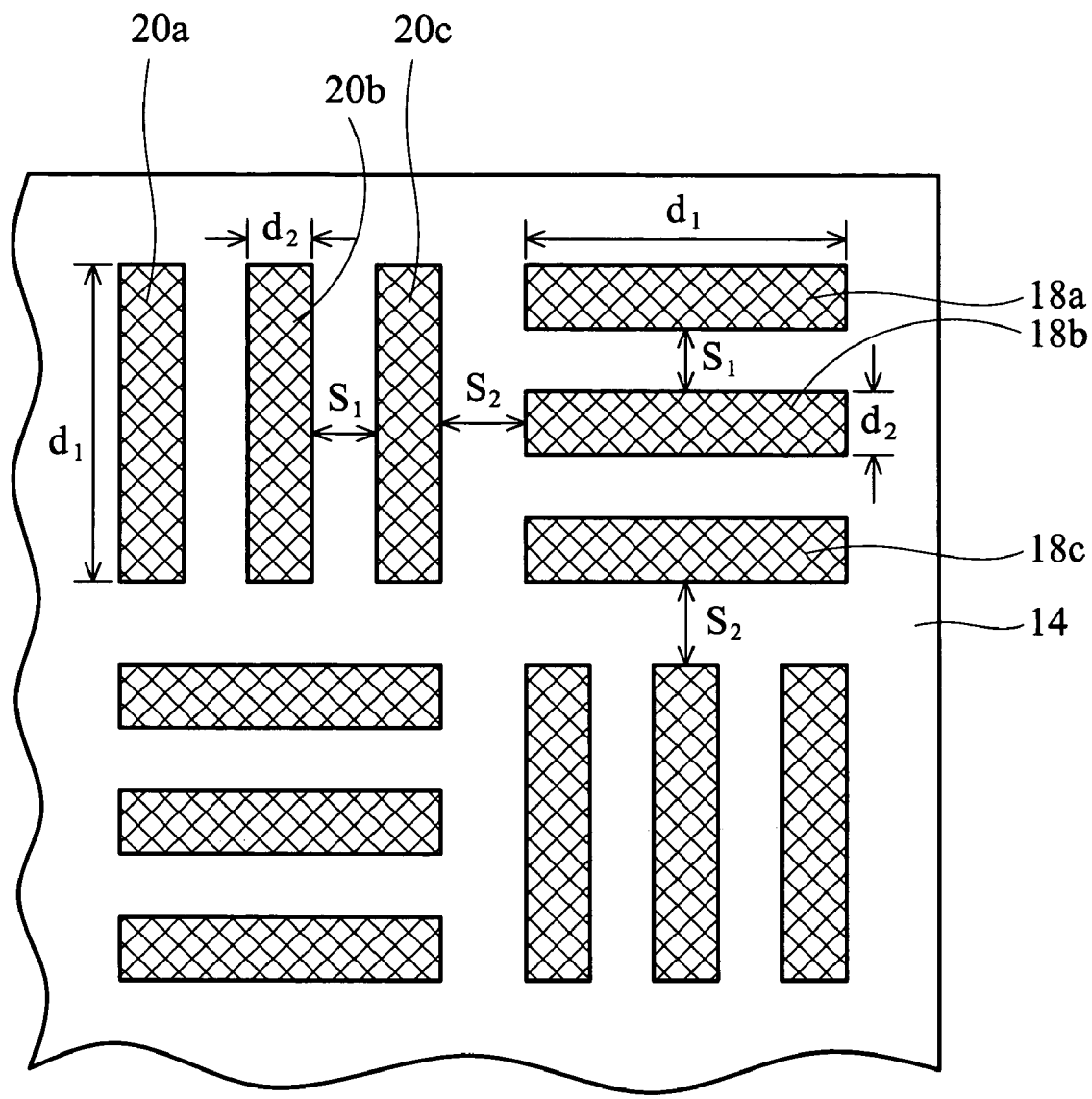
FIG. 3 is a plane view illustrating an exemplary embodiment of an exemplary embodiment of a dimension design for the line vias.

The line vias may be separated from each other with an appropriate distance allowed by a predetermined design rule. FIG. 3 is a plane view illustrating an exemplary embodiment of a dimension design for the line vias. The line vias 18a, 18b, 18c and the line vias 20a, 20b and 20c have an identical size, including the length $d_1$, the width $d_2$, the space $s_1$ kept between two line vias and the space $s_2$ kept between two via groups. The dimensions of $d_1$, $s_1$ and $d_2$ may be modified to keep the via group 18 or 20 as a square profile. Alternatively, each of the via groups 18 and 20 may be kept as a rectangular shape, a quadrilateral shape or any other geometric shape. In one embodiment, the length $d_1$ of the line via is between about 3.0 µm to 4.0 µm, the width $d_2$ of the line via is between about 0.25 µm to 0.35 µm, the space $s_1$ between two line vias within one via group is between about 1.0 µm to 2.0 µm, and the space $s_2$ between two via groups is between about 1.5 µm to 3.0 µm. In other embodiments, the dimensions of $d_1$, $s_1$ and $d_2$ may be modified with appropriate values allowed by a predetermined design rule Although the embodiment of the present invention illustrates line vias having an identical size in via groups, the present invention provides value when using line vias having different features in dimension and shape compared with each other in one via group or between two via groups.

The top via pattern 22 is formed in the IMD layer 14 by the use of any well-known process. For example, a plurality of openings corresponding in position to the line vias (e.g., 18a, 18b, 18c, 20a, 20b and 20c) is formed in the IMD layer 14 to expose portions of the $M_{top-1}$ metal layer 12 by the use of a typical lithographic and anisotropic etching operation (e.g., plasma etching or reactive ion etching). Filling the openings with conductive material is then accomplished, in one embodiment of the invention, using tungsten plug processes. It is to be appreciated other well-known plug process such as aluminum plug, copper plug, or silicide plug processes. Following the metal filling process, chemical mechanical polishing (CMP) may be used to planarized the surface if necessary. The $M_{top}$ metal layer 16, the passivation layer 24 for defining the pad window 26, a metal pad and a bonding wire are then accomplished according to procedures well known to those versed in the art. Although the embodiment of the present invention illustrate the via groups formed in the uppermost IMD layer, the present invention provides value when forming such via groups in two-level metal stack bond pad structures and up to eight-level metal stack bond pad structures for copper interconnection systems.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A bond pad structure, comprising:
   a first metal layer;
   a second metal layer overlying said first metal layer;
   a dielectric layer between said first metal layer and said second metal layer; and
   a metal via pattern located in said dielectric layer and electrically connecting said first metal layer and said second metal layer, wherein said metal via pattern comprises at least two first via groups and at least two second via groups adjacent to each other alternately arranged along a first direction and a second direction different from said first direction;
   wherein each first via group comprises at least two first line vias extending in said first direction, each second via group comprises at least two second line vias extending in said second direction, and said first line via does not cross said second line via, and
   wherein each first and second line via has a longer side and a shorter side.

2. The bond pad structure of claim 1, wherein the profile of said first via group is substantially square.

3. The bond pad structure of claim 1, wherein the profile of said second via group is substantially square.

4. The bond pad structure of claim 1, wherein said first line via and said second line via have an identical size.

5. The bond pad structure of claim 1, wherein said metal via pattern comprises a plurality of first via groups and second via groups arranged in a matrix array.

6. The bond pad structure of claim 1, further comprising an integrated circuit located under said bond pad structure.

7. A semiconductor device, comprising:
   an integrated circuit substrate;
   a first metal layer overlying said integrated circuit substrate;
   a dielectric layer overlying said first metal layer;
   a second metal layer overlying said dielectric layer; and
   a metal via pattern located in said dielectric layer and electrically connecting said first metal layer and said second metal layer, wherein said metal via pattern comprises a plurality of first via groups and second via groups alternately arranged along a first direction and a second direction different from said first direction and arranged in an array;
   wherein each of said first via groups comprises at least two first line vias, each of said second via groups comprises at least two second line vias, and said first line via does not cross said second line via, and
   wherein each first and second line via has a longer side and a shorter side.

8. The semiconductor device of claim 7, wherein at least one of said first line vias extends in said first direction, and at least one of said second line vias extends in said second direction different from said first direction.

9. The semiconductor device of claim 7, wherein the profile of said first via group is substantially square.

10. The semiconductor device of claim 7, wherein the profile of said second via group is substantially square.

11. The semiconductor device of claim 7, wherein said first line vias have an identical size and are arranged in parallel, and said second line vias have an identical size and are arranged in parallel.

12. The semiconductor device of claim 7, wherein said integrated circuit substrate comprises an integrated circuit located at said second metal layer.

* * * * *